United States Patent
Kim et al.

(10) Patent No.: US 7,358,190 B2
(45) Date of Patent: Apr. 15, 2008

(54) METHODS OF FILLING GAPS BY DEPOSITION ON MATERIALS HAVING DIFFERENT DEPOSITION RATES

(75) Inventors: Hong-gun Kim, Gyeonggi-do (KR); Kyu-tae Na, Seoul (KR); Eun-Kee Hong, Gyeonggi-do (KR); Ju-Seon Goo, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 209 days.

(21) Appl. No.: 10/732,931

(22) Filed: Dec. 11, 2003

(65) Prior Publication Data

US 2004/0144749 A1 Jul. 29, 2004

(30) Foreign Application Priority Data

Dec. 11, 2002 (KR) .................. 10-2002-0078779

(51) Int. Cl.
*H01L 21/311* (2006.01)
(52) U.S. Cl. .............. 438/694; 438/424; 438/435; 438/270; 438/437
(58) Field of Classification Search ............... 438/694, 438/270
See application file for complete search history.

(56) References Cited

U.S. PATENT DOCUMENTS

| | | | |
|---|---|---|---|
| 5,716,890 A * | 2/1998 | Yao | 438/624 |
| 6,117,698 A * | 9/2000 | Atobe et al. | 438/21 |
| 6,177,198 B1 * | 1/2001 | Schaefer | 428/423.4 |
| 6,177,698 B1 * | 1/2001 | Gruening et al. | 257/302 |
| 6,190,999 B1 * | 2/2001 | Hung et al. | 438/424 |
| 6,265,269 B1 * | 7/2001 | Chen et al. | 438/270 |
| 6,531,377 B2 * | 3/2003 | Knorr et al. | 438/435 |
| 6,593,207 B2 * | 7/2003 | Hong et al. | 438/424 |
| 2001/0041395 A1 * | 11/2001 | Ajmera et al. | 438/151 |
| 2003/0013272 A1 * | 1/2003 | Hong et al. | 438/437 |
| 2004/0183136 A1 * | 9/2004 | Williams et al. | 257/369 |

FOREIGN PATENT DOCUMENTS

KR 2001-39446 * 7/2001

OTHER PUBLICATIONS dictionary.com; 2003.*
Dobkin; High Density Plasma; published on internet Mar. 20, 2005.*
Dobins (High Density Plasma Deposition of SiO2; http://www.enigmatic-consulting.com/semiconductor_processing/CVD_Fundamentals/films/HDP_SiO2.html) web page created Mar. 2005.*

* cited by examiner

*Primary Examiner*—Nadine Norton
*Assistant Examiner*—Patricia A. George
(74) *Attorney, Agent, or Firm*—Myers Bigel Sibley & Sajovec, P.A.

(57) ABSTRACT

Methods of forming material in a gap in a substrate include forming a pattern to define a gap on a substrate. A bottom oxide layer is formed on a surface of the substrate and substantially filling the gap. The bottom oxide layer is etched back inside an opening in the gap to expose side walls of the gap so that a residual bottom oxide layer remains at a bottom of the gap. A top oxide layer is selectively deposited on the residual bottom oxide layer, wherein the top oxide layer is deposited in a first direction toward the opening at a faster rate than in a second direction away from the side walls.

7 Claims, 5 Drawing Sheets

METHODS OF FILLING GAPS BY DEPOSITION ON MATERIALS HAVING DIFFERENT DEPOSITION RATES

CLAIM FOR PRIORITY

This application claims priority to Korean Patent Application No. 2002-78779, filed on Dec. 11, 2002, the content of which is incorporated herein by reference.

FIELD OF THE INVENTION

The invention relates to methods of manufacturing semiconductor devices, and more specifically, to methods of forming insulation layers in semiconductor devices, such as memory devices.

BACKGROUND

As the size of features included in integrated circuit devices is reduced, the spacing between those features may be reduced. Voids or seams can occur if the gaps are incompletely filled, for example, with insulation layers. Voids and/or seams can be more likely when an aspect ratio of the gap (i.e., a ratio of the depth of the gap to the width of the gap opening) is increased.

FIGS. 1 to 3 are cross-sectional views that illustrate a conventional method of filling a gap. Referring to FIG. 1, a pattern is formed on a substrate 10 including gaps 14 that are subsequently filled by a material. For example, the pattern may be trenches, gate electrodes or interconnections. If the pattern includes trenches (as shown in FIG. 1), the trenches themselves can be considered to be the gaps 14 that are filled. On the other hand, if the pattern includes gate electrodes or the interconnections, spaces between the gate electrodes (or the interconnections) can be considered the gaps 14 that are filled.

Referring to FIG. 2, an isolation layer 18, such as a high-density plasma oxide layer or an undoped silicate glass (USG) layer, is deposited in the gaps 14. However, as shown in FIG. 2, voids 20a or seams 20b may occur in the gaps 14 if the aspect ratio of the gaps 14 is 8:1 or more.

Referring to FIG. 3, the insulation layer 18 containing the voids 20a or the seams 20b is planarized using, for example, chemical mechanical polishing methods or an etch back process. When the insulation layer 18 is planarized, some of the voids 20a and seams 20b may be exposed through an opening 20c in the surface.

Accordingly, remnants of a subsequently deposited conductive layer or other contaminant material may be deposited in the voids 20a and the seams 20b through the opening.

SUMMARY OF THE INVENTION

Embodiments according to the invention can provide methods of filling gaps using materials having different deposition rates. Pursuant to these embodiments, a first material can be formed on a bottom surface of the gap, where the first material has a first rate of deposition of oxide. An oxide material is deposited on the first material to grow the oxide material in the gap toward an opening in the gap at the first rate and away from the side wall of the gap at a second rate that is less than the first rate.

Accordingly, a material on the bottom of the gap promotes deposition at a greater rate than a different material on a side wall of the gap. The greater deposition rate of the material on the bottom of the gap can cause the growth occurs at a faster rate toward the opening of the gap than away from the side wall of the gap toward a central region of the gap.

In some embodiments according to the invention, the first material is formed to avoid forming the first material on the side wall nearer the opening in the gap. In some embodiments according to the invention, a second material is formed on the bottom surface of the gap and on the side wall of the gap, where the second material has a second rate of deposition of oxide thereon.

In some embodiments according to the invention, the gap is formed in the substrate through a hard mask thereon prior to forming the first material in the gap. In some embodiments according to the invention, the hard mask is removed from the substrate prior to forming the first material in the gap.

In some embodiments according to the invention, the first rate is about four times greater than the second rate. In some embodiments according to the invention, a depth of the gap is at least about eight times greater than a width of the gap.

In some embodiments according to the invention, the first material includes a first oxide layer and an ozone amount is introduced in a range between about 1 liter and about 18 liters to provide a concentration in a range between about 1.0% by weight and about 18% by weight to an environment containing the substrate. A TEOS is introduced to the environment at a rate in a range between about 100 sscm and about 1200 sscm.

In further embodiments according to invention, a pattern is formed to define a gap on a substrate. A bottom oxide layer is formed on a surface of the substrate and filling the gap. The bottom oxide layer is etched back inside an opening in the gap to expose side walls of the gap so that a residual bottom oxide layer remains at a bottom of the gap. A top oxide layer is selectively deposited on the residual bottom oxide layer, wherein the top oxide layer is deposited in a first direction toward the opening at a faster rate than in a second direction away from the side walls. In some embodiments according to the invention, the bottom oxide layer is formed to a thickness in a range between about 100 Angstroms and about 3600 Angstroms.

DESCRIPTION OF EMBODIMENTS ACCORDING TO THE INVENTION

Figure 1:
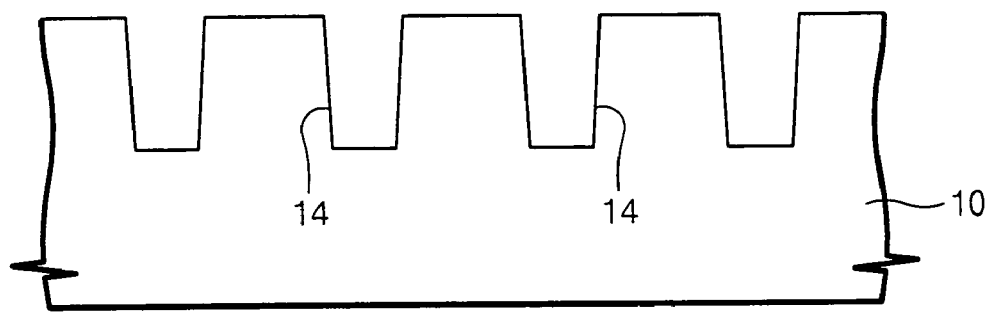
FIGS. 1-3 are cross-sectional views of a method of filling a gap during fabrication of a conventional semiconductor device.
Figure 2:
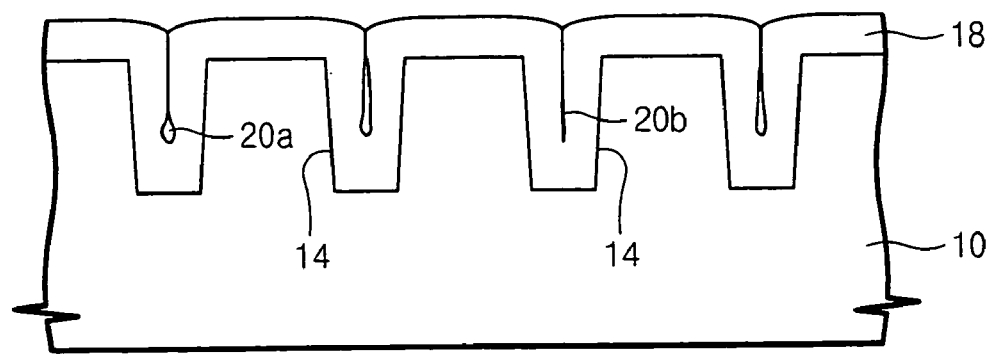
Figure 3:
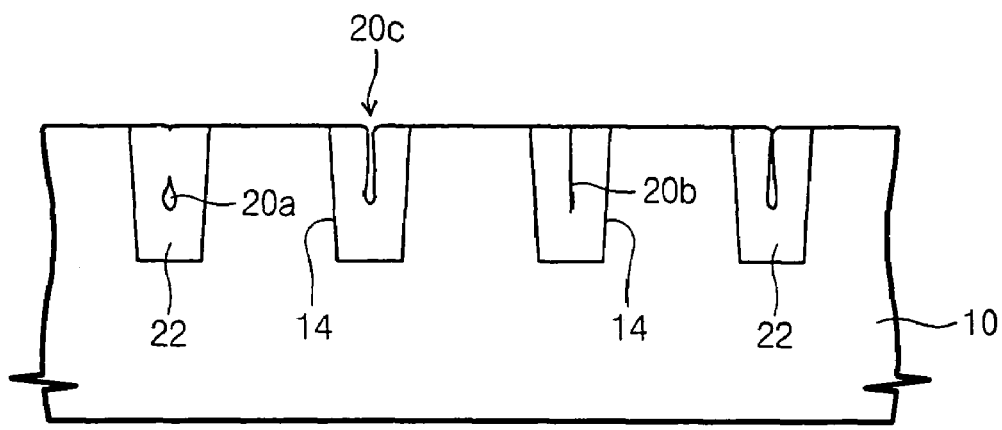

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will be understood that when an element such as a layer, region or substrate is referred to as being on another element, it can be directly on the other element or intervening elements may also be present.

Furthermore, relative terms, such as "lower" and "upper", may be used herein to describe one elements relationship to another elements as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompasses both an orientation of lower and upper, depending of the particular orientation of the figure.

It will be understood that although the terms first and second may be used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. Like numbers refer to like elements throughout.

Figure 4:
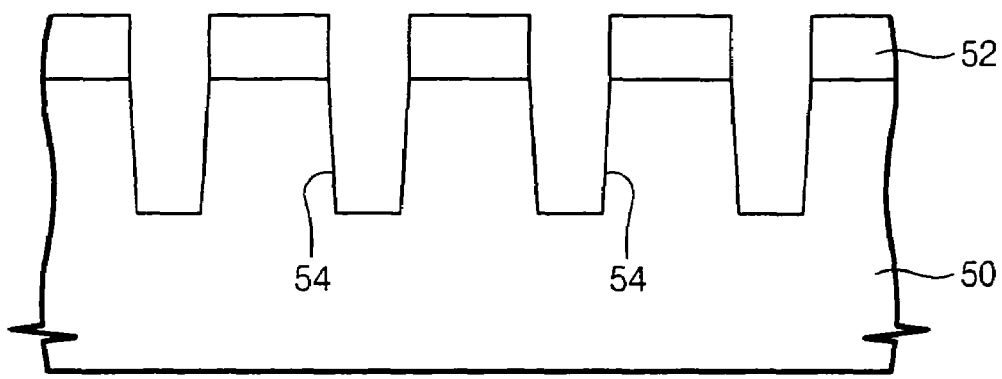
FIGS. 4-8 are cross-sectional views illustrating methods of filling gaps according to some embodiments of the invention.

FIG. 4 through FIG. 8 are cross-sectional views illustrating methods of filling gaps for forming trench isolation layer according to some embodiments of the invention. Referring to FIG. 4, a hard mask pattern 52 is formed on a substrate 50. The substrate 50 is etched using the hard mask pattern 52 as an etch mask to form trenches 54. The hard mask pattern 52 may include an oxide layer and a nitride layer, which are stacked on the substrate. The hard mask pattern remains 52 on the substrate 50. In some embodiments according to the invention, the hard mask pattern 52 includes an oxide layer, a polysilicon layer and/or a nitride layer.

Figure 5:
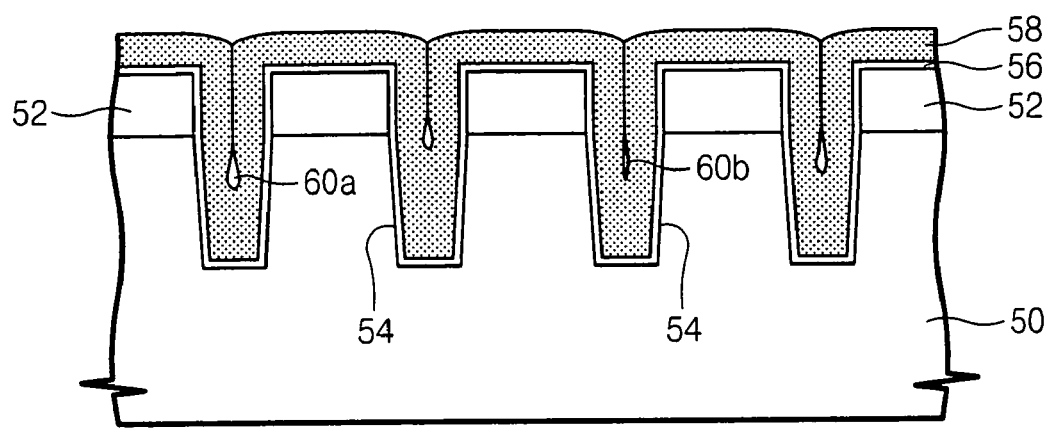

Referring to FIG. 5, a silicon nitride layer liner 56 is formed conformally on a surface of the substrate including on the hard mask pattern 52 and in the trenches 54. An oxide layer 58 is formed on a surface of the substrate 50 (and on the liner 56 in the trenches 54). In some embodiments according to the invention, a trench oxide layer is formed in the trench 54 using a thermal oxidation process before forming the liner 56. The oxide layer 58 is formed of an oxide material such as spun-on-glass (SOG), USG and/or high density plasma (HDP) etc. Because an aspect ratio of the trenches 54 is high, voids 60a or seams 60b may appear in the oxide layer 58 formed within the trenches 54.

Figure 6:
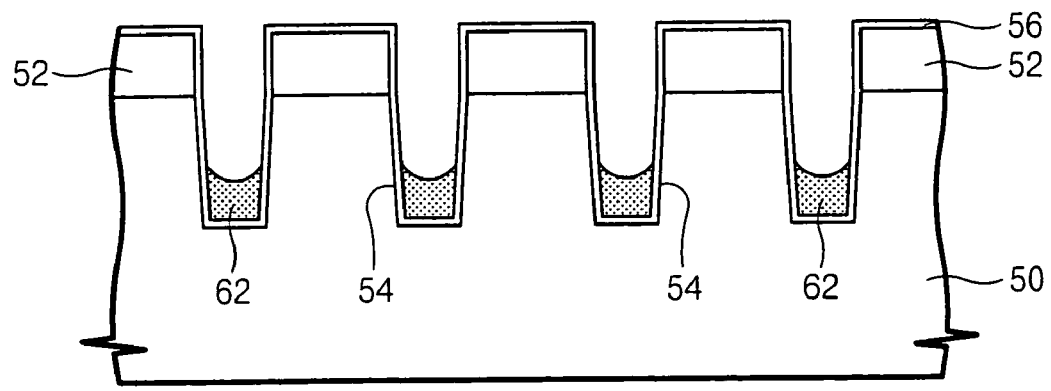

Referring to FIG. 6, the oxide layer 58 is etched back inside the trenches 54, using a wet etching process or a dry etching process, so that a lower oxide layer 62 remains at a bottom of the trenches 54. Furthermore, the oxide layer 58 is removed from surfaces of the trenches 54 above the lower oxide layer 62 and outside the trenches 54.

Figure 7:
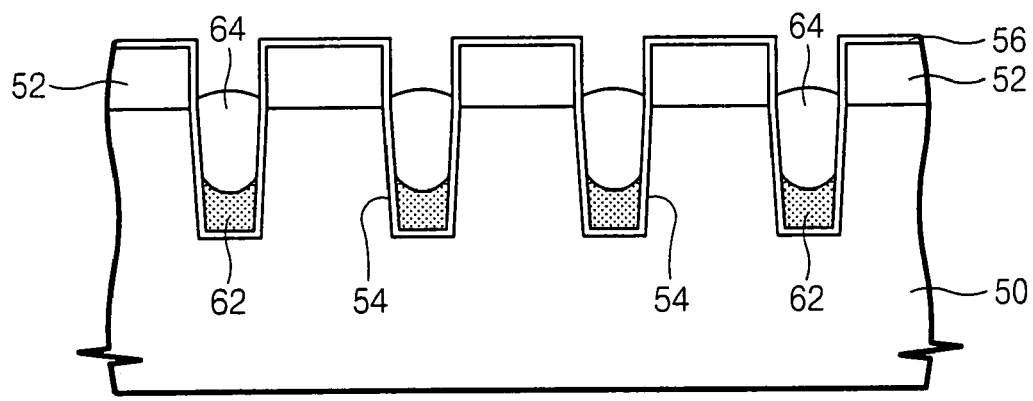

Referring to FIG. 7, an upper oxide layer 64 is selectively formed on the lower oxide layer 62 at bottom of the trenches 54. In some embodiments according to the invention, the upper oxide layer 64 is formed to be limited to within the trenches 54. In some embodiments according to the invention, the upper oxide layer 64 is deposited using an ozone and tetra-ethoxy-silane (TEOS) source. In some embodiments according to the invention, the upper oxide layer 64 is deposited with the source at a pressure in a range between about 200 torr and about 760 torr and at a temperature in a range between about 400° C. and about 480° C. In some embodiments according to the invention, an amount of ozone in a range between about 1 liter and about 18 liters is introduced (into an environment containing the substrate) in a concentration in a range between about 1% by weight and about 18% weight, and the TEOS is provided at a flow rate in a range between about 100 sccm and about 1200 sccm.

In some embodiments according to the invention, a material on the bottom of the trench promotes deposition at a greater rate than a different material on a side wall of the trench. The faster deposition of the material on the bottom of the trench allows the region where the voids or seams may otherwise be formed (i.e., in the central region above bottom of the trench) to be filled with an oxide before the deposition from the material on the side walls reaches the central region.

Referring to FIG. 7, the oxide layer may be deposited on the liner 56. However, the rate of deposition of the oxide layer formed on the bottom oxide layer can be faster than the deposition rate of the oxide layer formed on the liner 56 (on the side wall of the trenches 54). Accordingly, the upper oxide layer is grown according to a convex surface profile toward the opening of the trench 54 to a level below the opening.

The thickness of the lower oxide layer 62 on the bottom of the trenches 54 can be varied depending on the aspect ratio of the gaps. In some embodiments according to the invention, the thickness of the lower oxide layer 62 is in a range between about 100 Angstroms and about 3600 Angstroms to avoid formation of the void 60a and/or the seam 60b.

As will be appreciated by those skilled in the art given the benefit of this disclosure, during deposition, a source gas is absorbed on a material exposed to the deposition. As a result, an oxide layer, for example, is deposited by a reaction between the material and the source gas used for deposition. The absorbed source gas is desorbed simultaneously. For example, when the deposition temperature is low, a deposition rate of a silicon nitride layer or the oxide layer on the surface of the silicon layer or silicon nitride layer is low compared to the deposition rate of the oxide layer on the surface of another oxide layer. Therefore, the oxide layer is selectively formed on the other oxide layer. Furthermore, as the flow rate of the source gas decreases, the difference between deposition rate of the oxide layer and the silicon nitride layer or the silicon layer can be increased. For example, when the oxide layer is deposited at a temperature of 430° C., a pressure of 600 torr and TEOS of 350 sccm, the rate of deposition on oxide layer is about four times faster than deposition on the liner 56.

Figure 8:
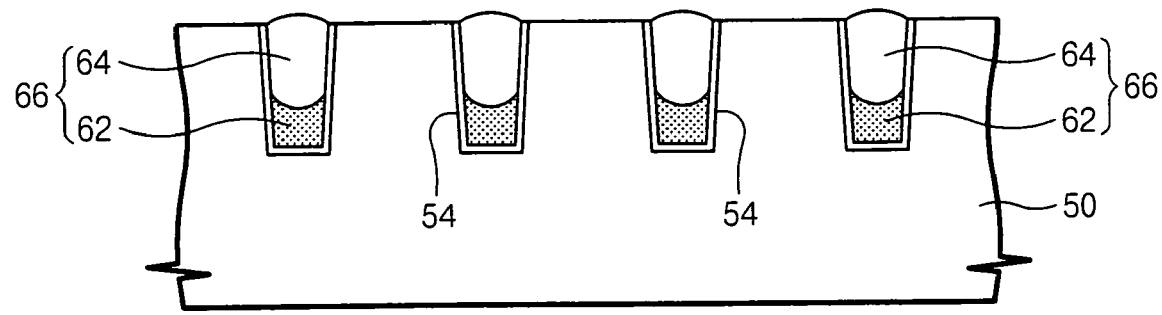

Referring to FIG. 8, the hard mask pattern 52 and the liner 56 on the substrate 50 outside the trench 52 are removed to expose a top part of the substrate 50. An isolation layer 66 including the lower and upper oxide layers 62 and 64 is formed. The lower and upper oxide layers 62 and 64 are stacked in the trenches 54.

Figure 9:
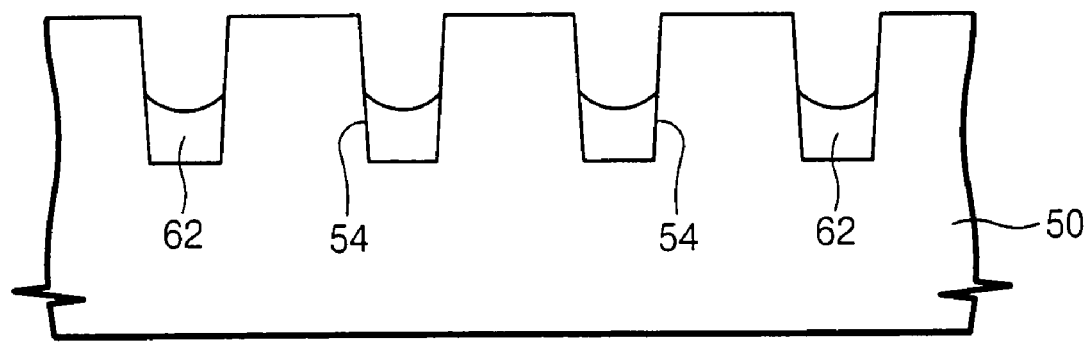
FIGS. 9-10 are cross-sectional views illustrating methods of filling gaps according to some embodiments of the invention.
Figure 10:
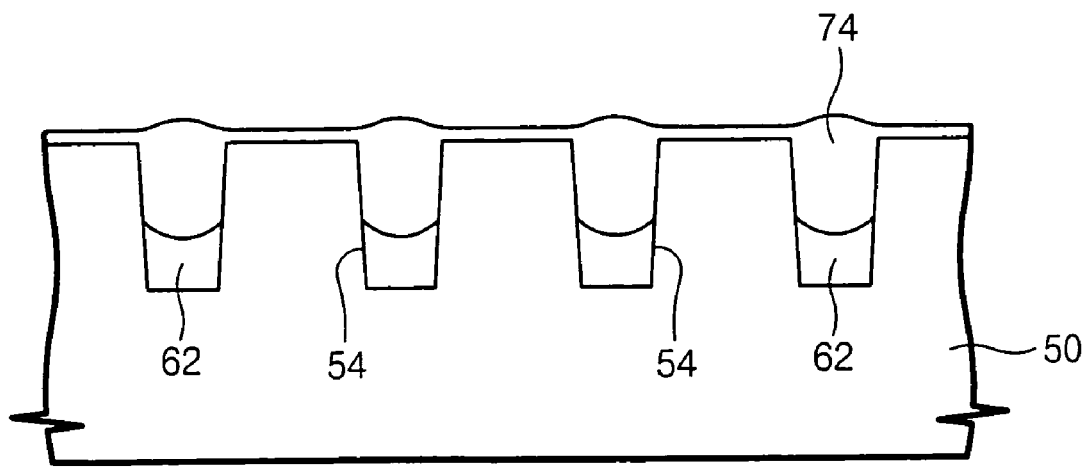

FIG. 9 and FIG. 10 are cross-sectional views illustrating a method of filling a gap according to some embodiments of the invention. Referring to FIG. 9, after forming the trenches 54 in the substrate 50, the lower oxide layer 62 is formed at bottom of the trenches 54. The oxide layer is formed on the surface of the substrate including in the trenches 54. The oxide layer is etched back inside the trenches 54 so that the oxide layer remains only on bottom portions of the trenches 54, whereupon the hard mask pattern (see 52 in FIG. 4) is removed thereby forming the lower oxide layer 62.

In some embodiments according to the invention, the hard mask pattern (see 52 in FIG. 4) is removed after forming the trenches 54. In particular, the oxide layer is formed on the surface of the substrate and the hard mask pattern 52 is removed. The oxide layer is etched back inside the trenches 54 to form the lower oxide layer 62 at bottom of the trenches 54. In some embodiments according to the invention, a trench oxide layer (not shown) is formed before forming the bottom oxide layer 62 using thermal oxidation process on the side wall of the trenches 54.

Referring to FIG. 10, an upper oxide layer 74 is formed on an entire surface of the substrate including in the trenches 54 on the lower oxide layer 62. The upper oxide layer 74 can be formed as disclosed above in reference to FIG. 7. In other words, the upper oxide layer 74 can be deposited at a pressure in a range between about 200 torr and about 760 torr at a temperature in a range between about 400° C. and about 480° C. In some embodiments according to the invention, an amount of ozone in a range between about 1 liter and about 18 liters is introduced (into an environment containing the substrate) to provide a concentration in a range between about 1% by weight and about 18% by weight, and the TEOS is provided at a rate in a range between about 100 sccm and about 1200 sccm.

The deposition rate of the oxide layer on the silicon layer can be higher than that of the oxide layer on the silicon nitride layer of FIGS. 5-8. However, when the oxide layer is deposited under the conditions that an amount of ozone in a range between about 1 liter and about 18 liters is introduced (into an environment containing the substrate) to provide a concentration in a range between about 1% by weight and about 18% by weight, and the TEOS is provided at 100 sccm to 1200 sccm at a temperature in a range between about 400° C. and about 480° C., the deposition rate of the oxide layer is higher than that of the silicon layer. Therefore, the trenches 54 are filled with the oxide layer without forming the void.

In some embodiments according to the invention, gaps (such as trenches or spaces between gate electrodes) are filled by depositing an oxide in the gap having a relatively high deposition rate material (such as an oxide layer) on the bottom of the trench and absent from the side wall of the trench. The side wall has a relatively low deposition rate material (such as a nitride layer or a silicon layer) formed thereon. The relatively high deposition rate of the material on the bottom of the gap can cause an oxide to grow faster on the bottom of the gap than on the side wall, which can cause faster growth in a central region of the gap (toward the opening of the gap) than in a region nearer the side wall. Accordingly, the formation of seams or voids in an oxide deposited in high aspect ratio gaps can be reduced.

While the invention has been particularly described with reference to the embodiments herein, it will be understood by those of ordinary skill in the art that various changes in form and details may be made therein without departing from the spirit and scope of the invention as defined by the following claims.

What is claimed:

1. A method of forming material in a gap in a substrate, the method comprising:
    forming a pattern to define a gap on a substrate, wherein an upper surface of the pattern and sidewalls of the gap comprise a non-oxide layer;
    forming a bottom oxide layer on a surface of the substrate and substantially filling the gap;
    etching back the bottom oxide layer inside an opening in the gap to expose the upper surface of the pattern and side walls of the gap so that a residual bottom oxide layer remains only at a bottom of the gap; and
    selectively growing a top oxide layer on the residual bottom oxide layer faster than on the non-oxide layer.

2. A method according to claim 1 wherein forming a pattern comprises:
    forming a hard mask pattern exposing a part of the substrate;
    etching the substrate using the hard mask pattern as an etch mask to form the gap; and
    conformally depositing a silicon nitride layer liner on a surface of the substrate including on the side walls of the gap.

3. A method claim 1 wherein the step of forming a pattern comprises:
    forming a hard mask pattern on the substrate exposing a part of the substrate;
    etching the substrate using the hard mask pattern as the etch mask to form the trench; and
    removing the hard mask pattern.

4. A method according to claim 3 wherein forming a trench oxide layer inner sidewall in the trench is performed before removing the hard mask pattern.

5. A method according to claim 1 wherein the top oxide layer is formed using ozone and TEOS as a source gas at a pressure in a range between about 200 torr and about 760 torr and at a temperature in a range between about 400° C. to 480° C. temperature in an environment containing the substrate.

6. A method according to claim 5 wherein an amount of ozone in a range between about 1 liter to about 18 liters is introduced to provide a concentration is a range between about 1% by weight and about 18% by weight, and TEOS is provided a rate in a range between about 100 sccm and about 1200 sccm.

7. A method according to claim 1 wherein forming a bottom oxide layer comprises forming the bottom oxide layer to a thickness in a range between about 100 Angstroms and about 3600 Angstroms.

* * * * *